(12) United States Patent
Jagmohan et al.

(10) Patent No.: US 7,990,290 B1
(45) Date of Patent: Aug. 2, 2011

(54) EFFICIENT RATELESS DISTRIBUTED COMPRESSION OF NON-BINARY SOURCES

(75) Inventors: Ashish Jagmohan, Yorktown Heights, NY (US); Demijan Klinc, Atlanta, GA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/699,592

(22) Filed: Feb. 3, 2010

(51) Int. Cl.
*H03M 7/00* (2006.01)
(52) U.S. Cl. .......................... 341/50; 714/800; 714/790
(58) Field of Classification Search .................... 341/50, 341/51; 714/800, 790, 781, 758
See application file for complete search history.

(56) References Cited

U.S. PATENT DOCUMENTS

| | | | |
|---|---|---|---|
| 7,246,177 B2 | 7/2007 | Anton et al. | |
| 7,721,184 B2* | 5/2010 | Luby et al. | 714/781 |
| 7,760,699 B1* | 7/2010 | Malik | 370/342 |
| 2006/0156181 A1* | 7/2006 | Ha et al. | 714/758 |
| 2007/0089025 A1 | 4/2007 | Hong et al. | |
| 2008/0016433 A1 | 1/2008 | Stolpman | |
| 2008/0201718 A1 | 8/2008 | Zohar | |
| 2008/0320363 A1 | 12/2008 | He et al. | |
| 2010/0095116 A1* | 4/2010 | He et al. | 713/168 |

OTHER PUBLICATIONS

Varodayan et al., "Rate-Adaptive Distributed Source Coding using Low-Density Parity-Check Codes", Information Systems Laboratory, Dept. of Electrical Engineering, Stanford University, Stanford, CA 94305.
Jiang et al., "Rateless Slepian-Wolf Coding Based on Rate Adaptive Low-Density-Parity-Check Codes", ISIT2007, Nice, France, Jun. 24-29, 2007, IEEE, downloaded on Jul. 31, 2009 from IEEE Xplore.
Ha et al., "Rate-Compatible Punctured Low-Density Parity-Check Codes With Short Block Lengths", IEEE Transactions on Information Theory, vol. 52, No. 2, Feb. 2006, pp. 728-738.
Zhong et al., "Compression of Non-Binary Sources Using LDPC Codes", 2005 Conference on Information Sciences and Systems, the Johns Hopkins University, Mar. 16-18, 2005.
Liu et al., "On the Role of Puncturing in Hybrid ARQ Schemes", ISIT 2003, Yokohama, Japan, Jun. 29-Jul. 4, 2003.
"Puncturing", Wikipedia, http://en.wikipedia.org/wiki/Puncturing, last printed Oct. 30, 2009.
Park et al., "Performance-Complexity Tradeoffs of Rateless Codes", School of EECS, KAIST, Daejeon, Korea.
Draper et al., "Rateless Coding for Arbitrary Channel Mixtures with Decoder Channel State Information", pp. 1-28.

* cited by examiner

*Primary Examiner* — Peguy JeanPierre
(74) *Attorney, Agent, or Firm* — Scully, Scott, Murphy & Presser, P.C.; Brian Verminski, Esq.

(57) ABSTRACT

A method, system and computer program product are disclosed for rateless compression of non-binary sources. In one embodiment, the method comprises representing a sequence of non-binary source symbols as a sequence of sets of binary values; selecting a code for compressing the sets of binary values; determining a puncturing pattern, based on the selected code; and puncturing the sets of binary values, in patterns based on the puncturing pattern, to form a sequence of unpunctured values. A sequence of computed syndromes is determined based on the sequence of non-binary source symbols; and the sequence of unpunctured values and the sequence of computed syndromes are combined to form an output stream of data representing said sequence of non-binary source symbols. In one embodiment, none of the sets of binary values is punctured completely, and, for example, each of the sets of binary values may be punctured only partially.

25 Claims, 6 Drawing Sheets

EXEMPLARY LDPC CODE STRUCTURE

| N1 SOURCE SYMBOLS | SETS OF PROBABILITIES |
|---|---|
| $Y_1$ | P1(1), P2(2),...PQ(1) |
| $Y_2$ | P1(1), P2(2),...PQ(2) |
| ... | ... |
| $Y_{N1}$ | P1(N1), P2(N1),...PQ(N1) |

FIG. 5

PROBABILITY MATRIX FOR ONE OF THE PARITIES

| ALPHABET SYMBOL | PROBABILITY |
|---|---|
| $A_1$ | 0 |
| $A_2$ | $1/2^i$ |
| ... | ... |
| $A_Q$ | $1/2^i$ |

EFFICIENT RATELESS DISTRIBUTED COMPRESSION OF NON-BINARY SOURCES

BACKGROUND OF THE INVENTION

1. Field of the Invention

This invention generally relates to compressing and decompressing data, and more particularly, the invention relates to rateless compression and decompression of non-binary sources in a distributed compression environment.

2. Background Art

Distributed compression involves the compression of correlated data sources wherein the encoder for a source does not have access to complete information about the other sources. One embodiment of distributed compression is the scenario wherein the encoder has to compress a data source (hereafter simply termed "source) when the decoder has access to a correlated data source (hereafter termed "side-information"), and the encoder does not have access to the side-information. In general, this side-information may arise from decoding correlated data sources encoded and transmitted by other encoders. The amount of compression that can be achieved in this case depends, in general, on the degree to which the source and side-information are correlated.

Rateless codes refer to codes used for transmitting information (either for compression, or for protecting the data from channels, or for other reasons) which can be decoded at multiple rates at the decoder, depending on necessity. For example, an exemplary rateless channel code may be one wherein if the number of channel errors is low, the decoder can decode and recover the source data from a rate, say R1 bits of the codeword, and if the number of channel errors is high, the decoder can decode and recover the source data from a larger rate, say R2 bits of the same codeword. As another example, an exemplary distributed compression code may be one wherein if the correlation between source and side-information correlation is high, the decoder can decode and recover the source data from a rate, say R1 bits of the codeword, and if the if the correlation between source and side-information correlation is low, the decoder can decode and recover the source data from a larger rate, say R2 bits of the same codeword. The advantage of using a rateless code is that the same code can be used to allow source recovery in varying conditions, with the decoder simply choosing to receive a data rate which is adapted to the conditions. This is useful when transmission conditions are not known a-priori or when these change with time. Rateless codes are also useful when a transmitter is multicasting to multiple receivers, each with different conditions. In another embodiment, the encoder learns of the transmission condition immediately prior to transmission, and decides the rate of transmission at that time. In this case, rateless codes are advantageous because the same code can be used with several different transmission conditions; thus, the number of codes which need to be stored at the encoder for use can be considerably reduced.

Rateless coding has recently received considerable attention and a number of rateless codes have been developed for binary sources. For example, rateless codes are disclosed in "Rate-adaptive distributed source coding using low-density parity-check codes" (Varodayan, et al.) (in Proc. Asilomar Pacific Grove, Calif., November 2005); U.S. patent application publication no. US 2006/0156181 A1, for "Method for puncturing an LDPC channel code" (Ha, et al.); U.S. patent application publication no. US 2008/0320363 A1 for "Method and apparatus for rateless source coding with/without decoder side information" (He, et al.); and "On Rate-adaptivity of non-binary LDPC codes", (Kline, et al.) (Proc. International Symposium on Turbo Codes & Related Topics, September 2008).

Varodayan, et al. describes how correlation adaptivity can be achieved by progressively sending accumulated syndromes. However, these codes are inefficient in that the performance of these codes is away from the compression limit. The method in Ha, et al. describes how binary ldpc codes can be punctured to achieve rate-adaptivity in the channel coding sense. Ha, et al. consider the channel coding problem and do not address how their methods can be applied for distributed compression.

The work in He, et al. considers puncturing variable nodes to achieve correlation adaptivity, however their solution only considers a simple approach wherein punctured variable nodes are punctured entirely, that is all bits in their binary representation, which is not best in terms of performance. The work in Kline, et al. considers bitwise puncturing of nonbinary ldpc codes. Kline, et al. show the benefits of puncturing a nonbinary ldpc code bitwise, however their work only applies to binary channels. Further, they do not address how bitwise puncturing can be applied for compression of distributed sources.

BRIEF SUMMARY

Embodiments of the invention provide a method, system and computer program product for rateless distributed compression of non-binary sources, wherein the decoder has access to side-information correlated with the source, possibly as a result of decoding other correlated sources. In one embodiment, the method comprises representing a sequence of non-binary source symbols as a sequence of sets of binary values; selecting a code for compressing the sets of binary values; determining a puncturing pattern, based on the selected code; and puncturing the sets of binary values, in patterns based on the puncturing pattern, to form a sequence of unpunctured values. A sequence of computed syndromes is determined based on the sequence of non-binary source symbols; and the sequence of unpunctured values and the sequence of computed syndromes are combined to form an output stream of data representing said sequence of non-binary source symbols.

In one embodiment, none of the sets of binary values is punctured completely, and in one embodiment, the puncturing includes puncturing each of the sets of binary values only partially. In an embodiment, the method further comprises receiving a rate of compression for compressing the sets of binary values, and the code is selected based on the rate of compression. In one embodiment, the sequence of non-binary source symbols has a specified length; and the code is selected based on said specified length.

In an embodiment, the sequence of non-binary source symbols has a given number of symbols; and the selected code has said given number of variable nodes. In one embodiment, the selected code and the sequence of non-binary source symbols are used to determine the sequence of computed syndromes. In one embodiment, a set of parities are computed from the selected code and the sequence of non-binary source symbols. This set of parities is used to represent the sequence of non-binary source symbols, and this set of parities is used to determine the sequence of computed syndromes.

In one embodiment, the method further comprises receiving a rate of compression for compressing the sets of binary values; and the puncturing pattern is determined based on the selected code and this rate of compression. In an embodiment, the representing includes computing a set of parities from the selected code and the sequence of non-binary source symbols; and the determining the puncturing pattern includes determining a puncturing vector having a multitude of components, each of said components corresponding to a respective one of the parities and specifying how to puncture said respective one of the parities.

In an embodiment of the invention, a compressed stream of nonbinary symbols is punctured such that the encoder can adapt the compression rate to varying levels of correlation between a source that needs to be compressed and its side information that is available only at the decoder. In contrast to some existing solutions that puncture nonbinary symbols entirely, an embodiment of the invention punctures the nonbinary symbols only partially, that is only a subset of bits in their binary representation. Embodiments of the invention are applicable to general nonbinary correlation channels.

By puncturing nonbinary symbols only partially, the uncertainty in the decoder is exponentially decreased, and as result the decoding performance is improved. Furthermore, embodiments of the invention enable a finer adaptation of the compression rate since the compressed stream is punctured bitwise as opposed to symbolwise.

DETAILED DESCRIPTION

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium, upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
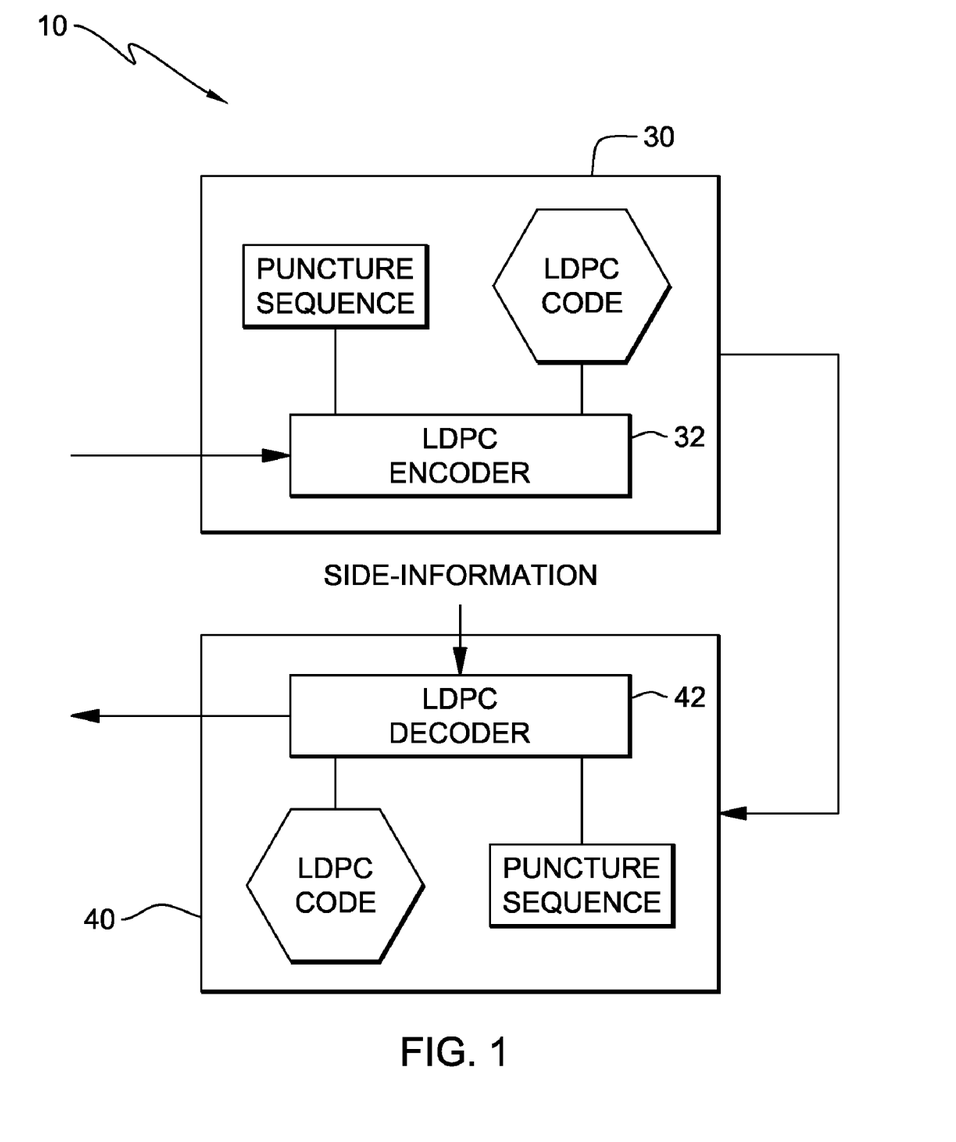
FIG. 1 is a functional block diagram of a system in accordance with an embodiment of the invention.

The present invention relates to rateless distributed compression and decompression of non-binary sources, and FIG.

1 is a functional block diagram of compression/decompression system 10 in accordance with an embodiment of the invention. Generally, system 10 includes encoder 30 and decoder 40. As shown and described below, the system and method of this embodiment operate to puncture structured irregular low-density parity check (LDPC) codes. It should be understood, however, that the system and method of exemplary embodiments of the present invention may be equally applicable to puncturing unstructured or otherwise randomly constructed LDPC codes, without departing from the spirit and scope of the present invention. It should further be understood that the transmitting and receiving entities may be implemented into any of a number of different types of systems that transmit coded or uncoded digital data.

In the illustrated system 10, a source supplies a sequence of information bits to the encoder 30. An LDPC encoder 32, using a selected LDPC code and a selected puncture sequence, punctures the codewords by removing selected bits from the codeword elements. The punctured sequence is then transmitted to the decoder.

The decoder 40 includes an LDPC decoder 42, and, using the same punctured sequences and LDPC codes used by the encoder, as well as side-information which is correlated to the source, iteratively decodes the received code block and outputs a decoded information vector. In this regard, the decoder can reconstruct the codeword by inserting values back into the punctured locations, and the decoder can then decode the reconstructed codeword.

In an example of the invention, a compressed stream of nonbinary symbols is punctured in a manner that enables the encoder to adapt the compression rate to varying levels of correlation between a source that needs to be compressed and the source's side information that is available only at the decoder. In this example, the source generates symbols over an alphabet of size Q, say the alphabet $(0,1, \ldots, Q-1)$, and each symbol of the alphabet also has a binary representation.

Figure 2:
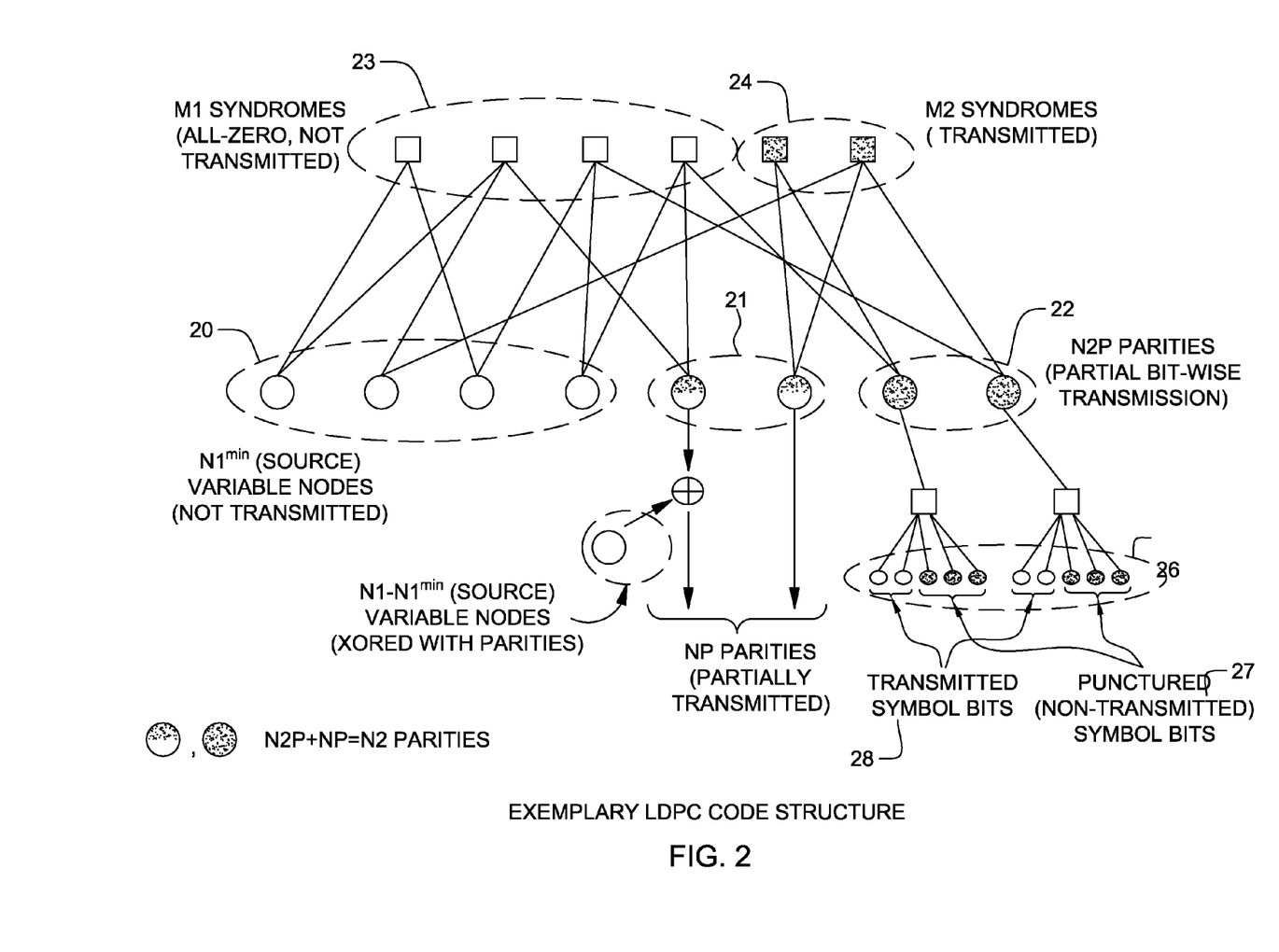
FIG. 2 illustrates the form of an LDPC code used in the encoder of the system of FIG. 1.

FIG. 2 illustrates the structure of the LDPC code used by the exemplary system embodiment. A general LDPC code is comprised of a set of variable nodes and a set of check nodes. In the LDPC code illustrated in FIG. 2, the variable nodes are partitioned into $N1^{min}$ source variable nodes 20 and N2 parity nodes (21 and 22). The N2 parity nodes are themselves partitioned into NP parity nodes 21 which endow the code with adaptivity to source length, and N2P parity nodes 22 which endow the code with rate-adaptivity. The check nodes are partitioned into M1 check nodes 23 whose value is fixed to 0, and are referred to as fixed syndromes, and M2 check nodes 24 that need to be calculated in the encoder, and referred to as computed syndromes. Thus the LDPC code C has $N1^{min}+N2$ variable nodes and M1+M2 check nodes. In an exemplary embodiment, M1 is equal to N2.

The code illustrated in FIG. 2 is parameterized by the values $N1^{min}$, N2, M1, M2, and the value $N1^{max}=N1^{min}+NP$. Let the number of source symbols be N1. To encode a source, source nodes 20 are set equal to the first $N1^{min}$ source symbols (defined on alphabet $\{0,1, \ldots, Q-1\}$). The N2 parities (21 and 22) are then set so as to ensure that the M1 syndrome nodes 304 are fixed to zero when computed as the sum of all connected variable nodes modulo the symbol alphabet size Q. Next the M2 syndromes 24 are computed as the sum of all connected variable nodes modulo the alphabet size Q. If the length of the source sequence is larger than $N1^{min}$, the additional source symbols are XORed bitwise with as many of the NP parities as needed. In an alternative embodiment the additional source symbols are added, modulo Q, to the computed parities. A subset of the modified NP parities is transmitted to the decoder, and all the M2 syndromes 24 are also transmitted to the decoder. The N2P parity values 22 (which belong to the symbol alphabet $\{0,1, \ldots, Q-1\}$) are converted to the binary representation 26, wherein each parity value is converted to the equivalent Q-bit binary string. For each of the N2P parities 22, some of the corresponding bits in the binary representation are selected for puncturing. All the punctured bits 27 from the N2P parities are not-transmitted to the decoder. The remaining bits 28 are transmitted to the decoder. The decision of which of the N2 node symbol and bit information to transmit is made on the basis of the desired transmission rates. In one embodiment the decoder selects which of the N2 node information to receive for decoding, based on the joint probability distribution (or some other statistical correlation metric) of the source and side-information. In another embodiment, the encoder has knowledge of the joint probability distribution (or some other statistical correlation metric) of the source and side-information, and computes an appropriate transmission rate, and transmits information based on this transmission rate. In another embodiment the desired transmission rate is an input to the encoder.

The decoder builds a probability model for all variable node information not received by it, encapsulating the probability that the variable node is a certain letter from the alphabet set $\{0, \ldots, Q-1\}$ for each letter, based on the side-information it has. In one embodiment, for variable nodes 20, the probability distribution of the possible variable node value is simply given by the conditional probability of the corresponding source symbol given the side-information. Similarly, the probability distribution on the unmodified variable nodes 21 can be straightforwardly computed on the basis of the received (possibly modified) values, the side-information, and the conditional probability distribution of the source given the side-information. Finally, the probability distribution of the parities 22 can be computed by assuming a uniform distribution on all letters from the alphabet $\{0, \ldots, Q-1\}$ which are consistent with the received bit-values corresponding to each node. Once these probability distributions have been computed, the decoder uses any conventional LDPC decoding algorithm (such as belief propagation) in order to recover the source information. In one embodiment, if the decoder fails to recover the data it requests the encoder for additional information such as variable node symbol or bit information generated but not transmitted (i.e. punctured) by the encoder.

Figure 3:
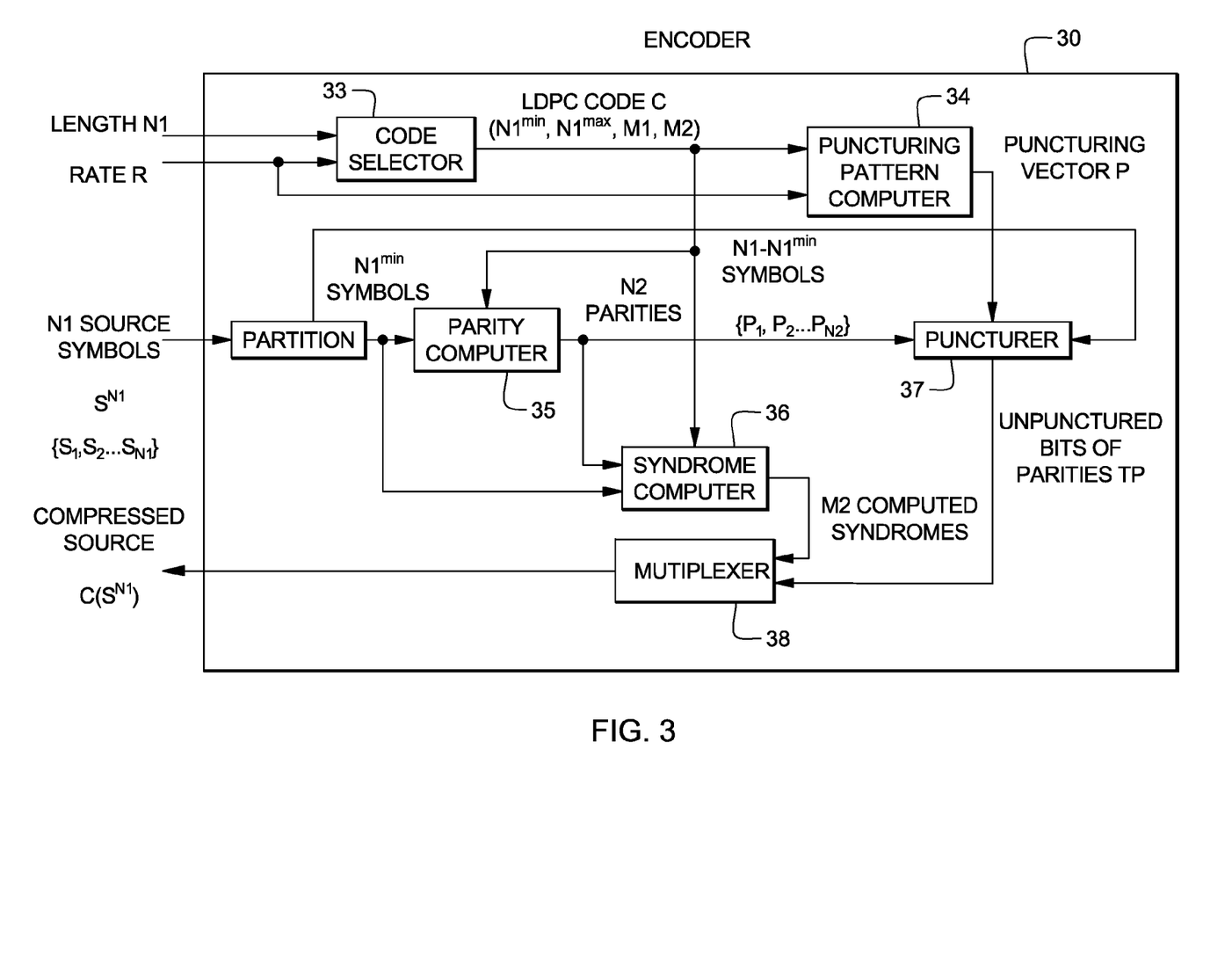
FIG. 3 shows the encoder of the system of FIG. 1 in more detail.

FIG. 3 illustrates encoder 30 in more detail, and as shown therein, the encoder receives three inputs: a scalar which specifies a length of the source sequence, say N1, the rate at which the encoder must compress the input sequence, say R, and a sequence of N1 source symbols. The encoder's task is to output a compressed (shorter) representation of the N1 source symbols. A detailed description of the encoder's operation is given below.

In the first stage, the Code Selector 33 chooses an LDPC code, call it C, according to input parameters N1 and R. The Code Selector can choose among a multitude of LDPC codes, where each code supports a certain range of source sequence lengths and a certain range of compression rates. An LDPC code C is chosen such that both N1 and R fall in the range of source sequence lengths and compression rates that C supports. The LDPC code C is then passed to the following three blocks: Puncturing Pattern Computer 34, Parity Computer 35, and Syndrome Computer 36.

The Puncturing Pattern Computer 34 determines how the LDPC code C is punctured. Computer 34 gets as input the code C and the desired rate R, and uses these to select or calculate a puncturing vector P with N2 components. In an exemplary embodiment, the puncturing vector is obtained by solving an optimization problem using the generalized density evolution method. In another embodiment, the puncturing vector is selected such that, after the M2 syndrome values and the $N1-N1^{min}$ sized subset from the variable nodes NP is transmitted, the remaining rate is divided equally among the N2P parity node bits. Each component of P corresponds to one parity symbol and specifies which bits in the binary representation of the corresponding parity must be punctured. The puncturing vector P is passed to the Puncturer 37.

The Parity Computer 35 computes the value of N2 parities. Computer 35 gets as input the first $N1^{min}$ source symbols and the LDPC code C. The N2 parities are calculated such that the value of M1 fixed syndromes is 0 and are passed to blocks: Syndrome Computer 36 and Puncturer 37. In an exemplary embodiment, M1 is equal to N2.

The Syndrome Computer calculates the values of M2 computed syndromes from $N1^{min}$ source symbols and N2 parities. At output, the Syndrome Computer passes a vector of M2 computed syndromes to the Multiplexer 38.

The Puncturer 37 punctures the parities such that the desired rate R is achieved. The inputs to the Puncturer include the puncturing vector P and the set of N2 parities. Each component of P specifies how the corresponding parity must be punctured. For each parity, the Puncturer 37 separates the bits that are not punctured and passes them to the output bitstream. The following example illustrates this procedure. Consider three parity symbols, each comprised of 3 bits: {a11, a12, a13}, {a21, a22, a23}, {a31, a32, a33}. Suppose also that the puncturing vector specifies that the following bits are punctured: bit 1 in the first parity, bits 2 and 3 in the second parity and bits 1 and 2 in the third parity. The Puncturer will pass the unpunctured bits to the output, which in this case will be: a12, a13, a21, a33. The puncturer also adds, modulo the alphabet size, the remaining $N1-N1^{min}$ source symbols to $N1-N1^{min}$ of the NP variable nodes, for transmission. The set of unpunctured/transmitted bits of parities and the $N1-N1^{min}$ variable nodes, call it TP, is passed to the Multiplexer 38.

The Multiplexer concatenates two inputs, the M2 computed syndromes and the unpunctured bits of parities, into a single stream C(N1), which is passed to the output of the Encoder. This concatenated stream is the compressed representation of the N1 source bits. This stream is sent to the decoder, illustrated in detail in FIG. 4.

Figure 4:
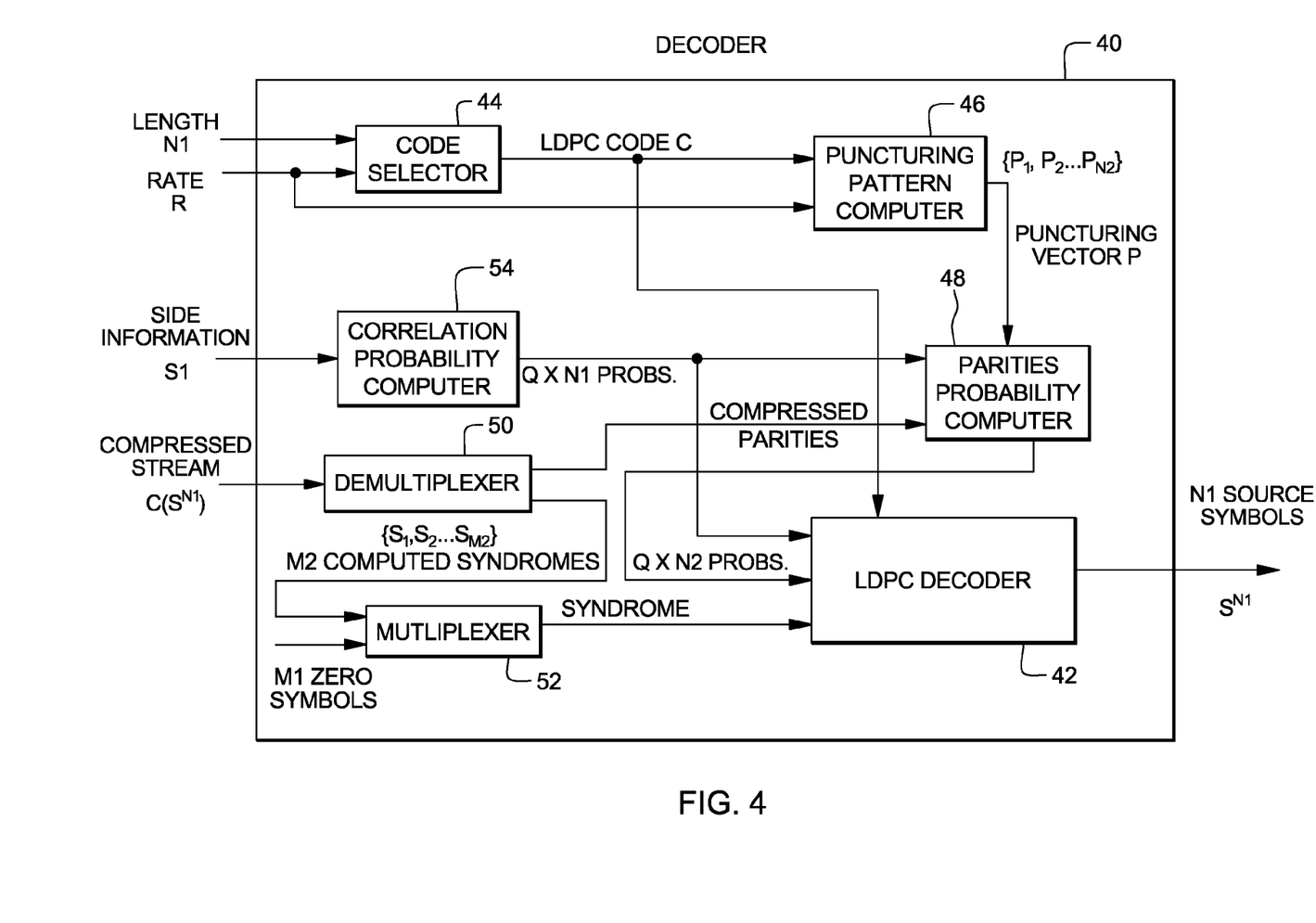
FIG. 4 shows the decoder of the system of FIG. 1 in more detail.

The Decoder 40 has four inputs: a scalar N1 which specifies the length of the uncompressed source sequence, the rate of compression R, a compressed representation of the source C(N1), and a vector containing side information about the source, call it SI. The Decoder's task is to recover (decompress) the original source sequence of length N1 from the provided four inputs.

In the first stage, the Code Selector 44, equivalent to the code Selector 33 in the Encoder 30, chooses an appropriate LDPC code C. The code is then passed to blocks: Puncturing Pattern Computer 46 and LDPC Decoder 42. The Puncturing Pattern Computer 46 is equivalent to the Puncturing Pattern Computer 34 described in the Encoder. Computer 46 computes and passes the puncturing vector P to the block Parity Probabilities Computer 48.

The compressed representation of the source C(N1) is passed as input to the Demultiplexer 50, which separates the stream in two parts: M2 computed syndromes, and the set of unpunctured/transmitted bits of parities TP. The M2 computed syndromes are passed to the Multiplexer 52 and the set TP is passed to the Parity Probabilities Computer 48.

Figure 5:
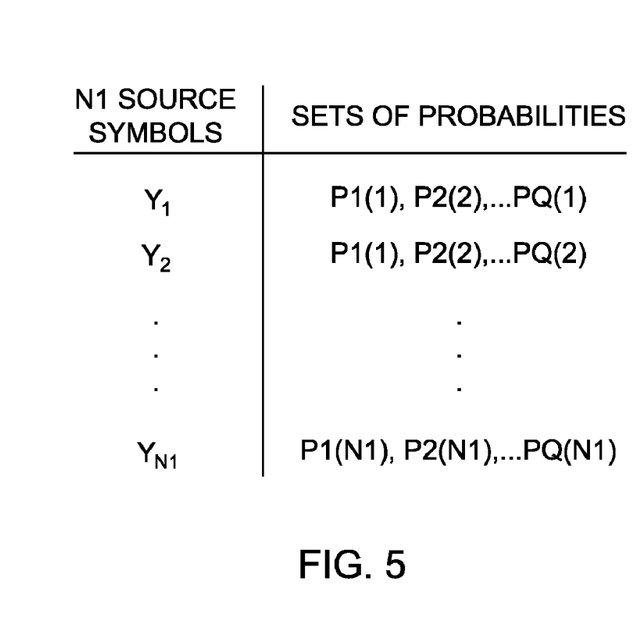
FIG. 5 depicts a first probability matrix used in the decoder.

The vector with side information SI is passed to the Correlation Probabilities Computer 54. The task of the Correlation Probabilities Computer is to calculate a set of Q probabilities $p1, p2, \ldots, pQ$, for each of the N1 source symbols. For a fixed source symbol i, pj(i), where $1<=j<=Q$, tells the probability that the source symbol i is equal to the alphabet symbol j. Hence, as represented in FIG. 5, at the output of the Correlation Probabilities Computer, we have a matrix with Q×N1 elements, which is passed to the LDPC decoder 42.

The Parity Probabilities Computer 48 receives as input the set of unpunctured/transmitted parities TP and the puncturing vector P. The task of computer 48 is to calculate a set of Q probabilities for each of the N2 parities. This process is described as follows. For the subset of the NP parities which are combined with the source symbols (if any), the probability is computed based on the conditional probability of the source given the side-information, and the received parity symbols. For the N2P bitwise punctured parities, the Parity Probabilities Computer fetches the corresponding puncturing information from the puncturing vector P. The puncturing information tells which bit positions in the binary representation of the considered parity were punctured and which were not. Computer 48 then fetches the corresponding unpunctured/transmitted bits from the set TP and sets these bits on the unpunctured bit positions. Given the bits from TP at the unpunctured locations, some symbols from the alphabet are impossible (if at least one of the bits does not match), therefore the probability for each of these symbols is set to 0.

Figure 6:
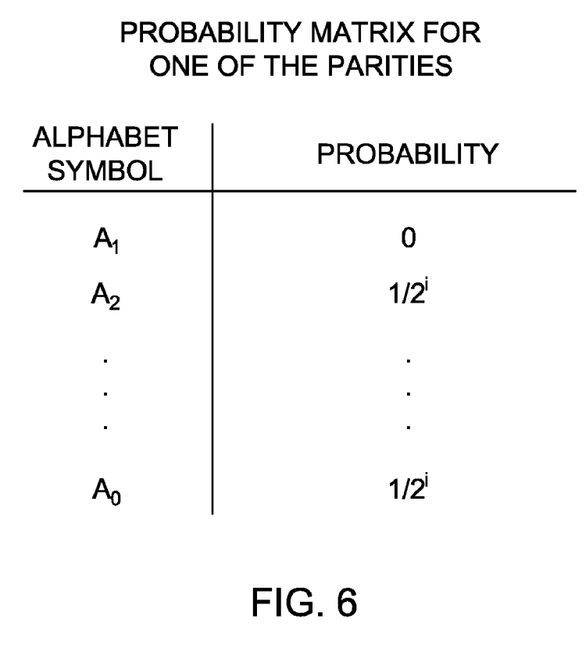
FIG. 6 illustrates a second probability matrix used in the decoder.

The remaining symbols are possible (bits match on all unpunctured locations), each with the same probability. Assuming that i bits in a parity are punctured, the probability for each of $2^i$ possible alphabet symbols is set to $1/(2^i)$. Parity Probabilities Computer 48 then combines the probability information of the NP and the N2P parities and passes the resulting matrix, represented in FIG. 6, with Q×N2 probabilities to the LDPC decoder.

The Multiplexer 52 gets as input a vector of M1 zero symbols and a vector of M2 computed syndromes, and the Multiplexer concatenates these inputs into a single stream S, which now contains the values of all M1+M2 check nodes/syndromes. In an exemplary embodiment M1 is equal to N2. Stream S is passed to the LDPC Decoder 42.

LDPC Decoder gets four inputs: the set of syndrome values S, the Q×N1 matrix containing probabilities for each of N1 source symbols, the Q×N2 matrix containing probabilities for each of N2 parities, and the LDPC code C. The Decoder performs iterative decoding to recover the N1 source symbols and passes these symbols to the output of the Decoder. This output is the set of N1 recovered (decompressed) source symbols.

Figure 7:
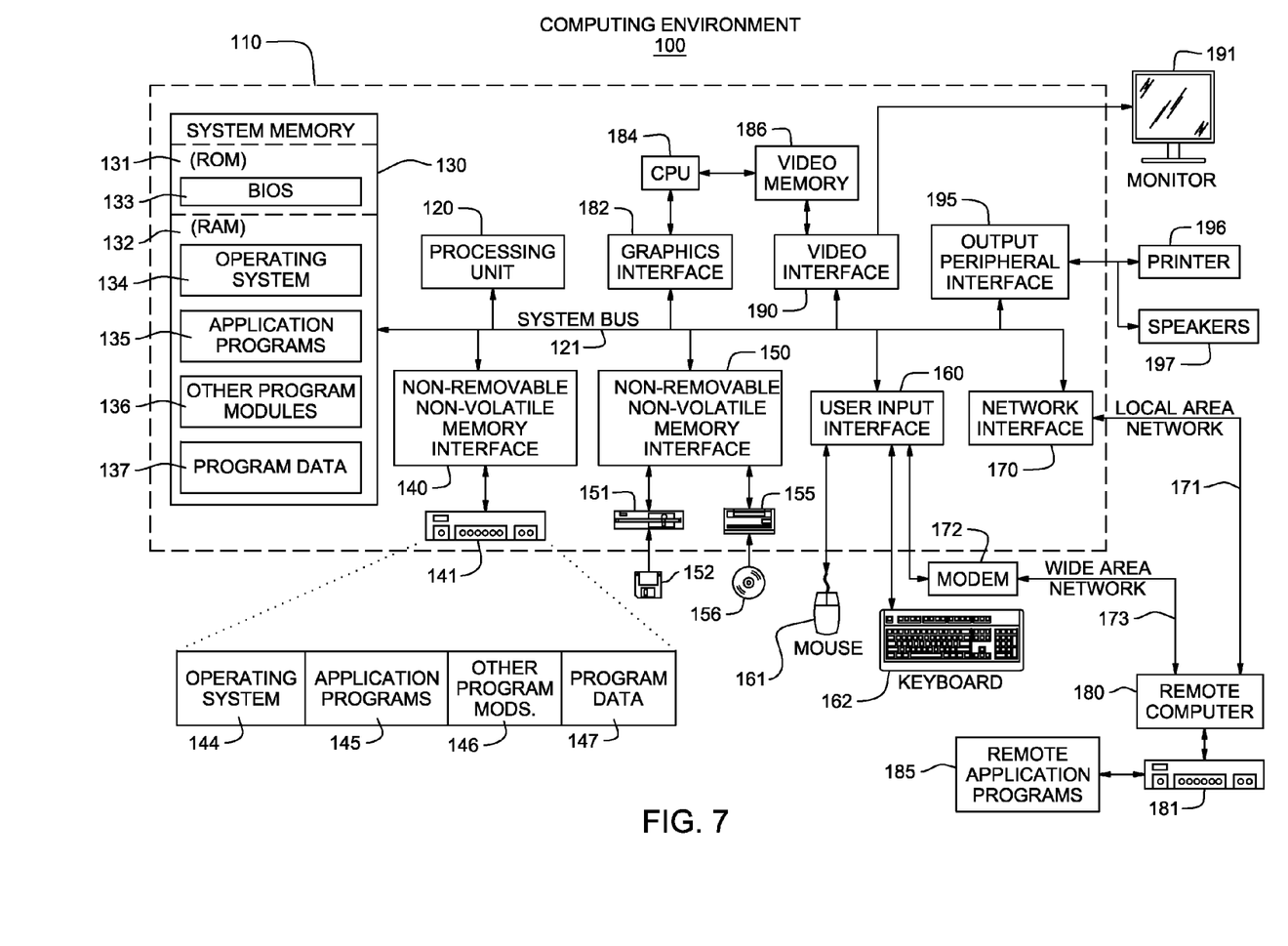
FIG. 7 shows a computing environment in which embodiments of the invention may be implemented.

FIG. 7 illustrates an example of a suitable computing system environment 100 in which the invention may be implemented, although as made clear above, the computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

With reference to FIG. 7, an exemplary system for implementing the invention includes a general purpose-computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 110.

Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 9 illustrates operating system 134, application programs 135, other program modules 136, and program data 137.

The computer 110 may also include other removable/non-removable, volatile/nonvolatile computer storage media. By way of example only, FIG. 9 illustrate a hard disk drive 141 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 11 provide storage of computer readable instructions, data structures, program modules and other data for the computer 110. In FIG. 9, for example, hard disk drive 141 is illustrated as storing operating system 144, application programs 545, other program modules 146, and program data 147. Note that these components can either be the same as or different from operating system 134, application programs 135, other program modules 136, and program data 137. Operating System 144, application programs 145, other program modules 146, and program data 547 are given different numbers here to illustrate that, at a minimum, they are different copies.

A user may enter commands and information into the computer 110 through input devices such as a keyboard 162 and pointing device 561, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus 121, but may be connected by other interface and bus structures, such as a parallel port, game port or a universal serial bus (USB).

A monitor 191 or other type of display device is also connected to the system bus 121 via an interface, such as a video interface 190. A graphics interface 182, such as Northbridge, may also be connected to the system bus 121. Northbridge is a chipset that communicates with the CPU, or host-processing unit 120, and assumes responsibility for accelerated graphics port (AGF) communications. One or more graphics processing units (GPUs) 184 may communicate with graphics interface 182. In this regard, GPUs 184 generally include on-chip memory storage, such as register storage and GPUs 184 communicate with a video memory 186. GPUs 184, however, are but one example of a coprocessor and thus a variety of co-processing devices may be included in computer 110. A monitor 191 or other type of display device is also connected to the system bus 121 via an interface, such as a video interface 190, which may in turn communicate with video memory 186. In addition to monitor 191, computers may also include other peripheral output devices such as speakers 197 and printer 196, which may be connected through an output peripheral interface 195.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 9. The logical connections depicted in FIG. 9 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 11 illustrates remote application programs 185 as residing on memory device 181. It will be appreciated that the network connections shown are exemplary and other means of establishing a communications link between the computers may be used.

One of ordinary skill in the art can appreciate that a computer 110 or other client device can be deployed as part of a computer network. In this regard, the present invention pertains to any computer system having any number of memory or storage units, and any number of applications and processes occurring across any number of storage units or volumes. The present invention may apply to an environment with server computers and client computers deployed in a network environment, having remote or local storage. The present invention may also apply to a standalone computing device, having programming language functionality, interpretation and execution capabilities.

Thus, methods, systems, and computer program products for rateless distributed compression of non-binary sources have been described. In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

The invention claimed is:

1. A method of rateless compression of non-binary sources, comprising:
   selecting a code for compressing a sequence of non-binary source symbols;
   representing the sequence of non-binary source symbols as a sequence of sets of binary values;
   determining a puncturing pattern, based on the selected code;
   puncturing the sets of binary values, in patterns based on the puncturing pattern, to form a sequence of unpunctured values;
   determining a sequence of computed syndromes based on the sequence of non-binary source symbols; and
   combining the sequence of unpunctured values and the sequence of computed syndromes to form an output stream of data representing said sequence of non-binary source symbols.

2. The method according to claim 1, wherein none of the sets of binary values is punctured completely.

3. The method according to claim 1, further comprising:
   receiving a rate of compression for compressing the sets of binary values: and
   wherein the selecting a code includes selecting the code based on the rate of compression.

4. The method according to claim 3, for use with a decoder for decompressing said output stream, and wherein the rate of compression is determined on the basis of known statistics of a correlated side-information symbol sequence which is available at the decoder.

5. The method according to claim 3, wherein:
   the sequence of non-binary source symbols has a specified length; and
   the selecting a code further includes selecting the code based on said specified length.

6. The method according to claim 1, wherein:
   the sequence of non-binary source symbols has a given number of symbols; and
   the selected code has a number of variable nodes equal to said given number.

7. The method according to claim 1, wherein the determining the sequence of computed syndromes includes using the selected code and the sequence of non-binary source symbols to determine the sequence of computed syndromes.

8. The method according to claim 1, wherein:
   the representing includes computing a set of parities from the selected code and the sequence of non-binary source symbols; and
   the determining a sequence of computed syndromes includes using said computed parities to compute said syndromes.

9. The method according to claim 1, further comprising:
   receiving a rate of compression for compressing the sets of binary values; and
   wherein the determining the puncturing pattern includes determining the puncturing pattern based on the selected code and said rate of compression.

10. The method according to claim 1, wherein:
    the representing includes computing a set of parities from the selected code and the sequence of non-binary source symbols; and
    the determining the puncturing pattern includes determining a puncturing vector having a multitude of components, each of said components corresponding to a respective one of the parities and specifying how to puncture said respective one of the parities.

11. A system for the rateless compression of non-binary sources, comprising one or more processing units configured to function as:
    a code selector for selecting a code for compressing a sequence of non-binary source symbols;
    a parity computer for representing the sequence of non-binary source symbols as a sequence of sets of binary values;
    a puncturing pattern computer for determining a puncturing pattern, based on the selected code;
    a puncturer for puncturing the sets of binary values, in patterns based on the puncturing pattern, to form a sequence of unpunctured values;
    a syndrome computer to determine a sequence of syndromes based on the sequence of non-binary source symbols; and
    a multiplexer for combining the sequence of unpunctured values and the sequence of computed syndromes to form an output stream of data representing said sequence of non-binary source symbols.

12. The system according to claim 11, wherein none of the sets of binary values is punctured completely.

13. The system according to claim 11, wherein the selector selects the code based on a given rate of compression for the binary values and on the length of the sequence of non-binary source symbols.

14. The system according to claim 11, wherein the syndrome computer determines the sequence of syndromes based on the sequence of non-binary source symbols and the selected code.

15. The system according to claim 11, wherein:
    the parity computer computes a multitude of parities representing the sequence of non-binary source symbols; and
    the puncturing pattern computer determines a puncturing vector having a multitude of components, each of said components corresponding to a respective one of the parities and specifying how to puncture the respective one of the parities.

16. An article of manufacture comprising:
at least one tangible computer readable medium having computer readable program code logic to execute machine instructions in one or more processing units for the rateless compression of non-binary sources, said computer readable program code logic, when execution, performing the following:
reading a sequence of non-binary source symbols;
selecting a code for compressing the sequence of non-binary source symbols;
representing the sequence of non-binary source symbols as a sequence of sets of binary values;
determining a puncturing pattern, based on the selected code;
puncturing the sets of binary values, in patterns based on the puncturing pattern, to form a sequence of unpunctured values;
determining a sequence of computed syndromes based on the sequence of non-binary source symbols; and
combining the sequence of unpunctured values and the sequence of computed syndromes to form an output stream of data representing said sequence of non-binary source symbols.

17. The article of manufacture according to claim 16, wherein none of the sets of binary values is punctured completely.

18. The article of manufacture according to claim 16, wherein the selecting the code includes selecting the code based on a given rate of compression for the binary values and on the length of the sequence of non-binary source symbols.

19. The article of manufacture according to claim 16, wherein the determining the sequence of syndromes includes determining the sequence of syndromes based on the sequence of non-binary source symbols and the selected code.

20. The article of manufacture according to claim 16, wherein:
the representing includes computing a multitude of parities representing the sequence of non-binary source symbols; and
the determining the puncturing pattern includes determining a puncturing vector having a multitude of components, each of said components corresponding to a respective one of the parities and specifying how to puncture the respective one of the parities.

21. A method of rateless decompression of a stream of compressed data comprising:
receiving said stream of compressed data, wherein said stream of compressed data represents a compressed sequence of non-binary source symbols, and said sequence of non-binary source symbols are taken from an alphabet having a given number of alphabet symbols;
using said stream of compressed data to obtain a sequence of compressed parities and a sequence of syndromes;
generating a set of source probabilities for each of the source symbols, said sets of source probabilities correlating the source symbols with the alphabet symbols;
selecting a code for decompressing the stream of compressed data;
generating puncturing information based on the selected code;
generating a set of parity probabilities for each of the compressed parities, based on the puncturing information and the sets of parity probabilities, correlating the compressed parities with the alphabet symbols;
using the sets of source probabilities, the sets of parity probabilities, and the syndromes, recovering the sequence of non-binary source symbols.

22. The method according to claim 21, wherein each set of source probabilities indicates a probability of said each of the source symbols being each of the alphabet symbols.

23. The method according to claim 21, wherein each set of parity probabilities indicates a probability of said each of the compressed parities being each of the alphabet symbols.

24. The method according to claim 21 wherein the recovery includes using a decoder for recovering the sequence of non-binary source symbols, and the decoder additionally uses a stream of side-information data to compute the source probabilities.

25. The method according to claim 21, wherein:
the receiving includes receiving a compression rate and a value indicating the number of symbols in the sequence of non-binary source symbols;
the selecting the code includes selecting the code based on the compression rate and the number of symbols in the sequence of non-binary source symbols;
the puncturing information identifies punctured bit locations and unpunctured bit locations; and
the generating the set of parity probabilities includes placing values from the compressed parities in said unpunctured bit locations.

* * * * *